United States Patent [19]

Kecmer

[11] Patent Number: 4,775,260

[45] Date of Patent: Oct. 4, 1988

[54] PRINTED CIRCUIT BOARD MOUNTING APPARATUS

[75] Inventor: Robert P. Kecmer, Fair Lawn, N.J.

[73] Assignee: Rexnord Inc., Torrance, Calif.

[21] Appl. No.: 43,032

[22] Filed: Apr. 27, 1987

[51] Int. Cl.[4] ............................. B25G 3/00; F16D 1/00
[52] U.S. Cl. ................................. 403/409.1; 403/374; 361/415
[58] Field of Search ............................. 403/374, 409.1; 269/224, 234; 411/6, 7, 24, 25, 26; 361/415, 386

[56] References Cited

U.S. PATENT DOCUMENTS

| | | |
|---|---|---|
| 1,217,539 | 2/1917 | Underwood . |
| 2,366,263 | 1/1945 | Husted ............................. 269/224 |
| 2,745,303 | 5/1956 | Cornelius ......................... 411/6 X |
| 3,274,744 | 9/1966 | Blum et al. ......................... 52/704 |
| 3,294,140 | 12/1966 | Cosenza . |
| 3,404,716 | 10/1968 | Cosenza . |
| 3,451,034 | 6/1969 | Beale . |
| 3,575,482 | 4/1971 | MacMaster et al. . |
| 3,639,888 | 2/1972 | Pittman et al. . |
| 3,678,342 | 7/1972 | Shaw ................................. 317/100 |
| 3,767,058 | 10/1973 | Barlow et al. . |
| 3,971,186 | 7/1976 | Havelka et al. ................... 52/753 G |
| 3,975,805 | 8/1976 | Spurling et al. . |
| 4,318,157 | 3/1982 | Rank et al. ......................... 361/386 |
| 4,354,770 | 10/1982 | Block ............................. 403/409.1 |
| 4,414,605 | 11/1983 | Chino et al. ....................... 361/388 |
| 4,480,287 | 10/1984 | Jensen . |

FOREIGN PATENT DOCUMENTS

| | | |
|---|---|---|
| 108532 | 8/1917 | United Kingdom ................... 411/6 |
| 647078 | 12/1950 | United Kingdom . |
| 1151972 | 5/1967 | United Kingdom . |
| 2111758 | 7/1983 | United Kingdom . |
| 2166004 | 4/1986 | United Kingdom . |

OTHER PUBLICATIONS

Calmark Corporation Parts Catalog, p. 16, "Series V-Visual Lock Indicator for 'Card-Lok' Retainer."
Marstein, Howard W., "Packaging Hardware Evolves with Advancing Technology," *Electronic Packaging and Production,* Nov. 1983.
"Ejection Mechanism for Circuit Boards", NASA Tech Briefs, Mar./Apr. 1986.

*Primary Examiner*—Andrew V. Kundrat
*Attorney, Agent, or Firm*—Pretty, Schroeder, Brueggeman & Clark

[57] ABSTRACT

A locking wedge apparatus for fastening a printed circuit board within an elongated slot in a rack. The apparatus includes an elongated center wedge having sloped surfaces at its opposite ends and two end wedges abutting against the center wedge's slopes surfaces. A screw extends lengthwide through a channel in the center wedge to connect together the two end wedges. Rotating the screw in a forward direction draws the two end wedges toward each other, causing them to slide on the center wedge's sloped surfaces and thereby deflect transversely to lock the printed circuit board in place. A clutch mechanism limits the maximum torque that can be applied to the screw, to provide predetermined tightening of the apparatus and thereby prevent physical or functional damage to the printed circuit board. A biasing spring biases the wedges into longitudinal alignment, to facilitate initial installation of the printed circuit board and wedge assembly into the slot.

6 Claims, 4 Drawing Sheets

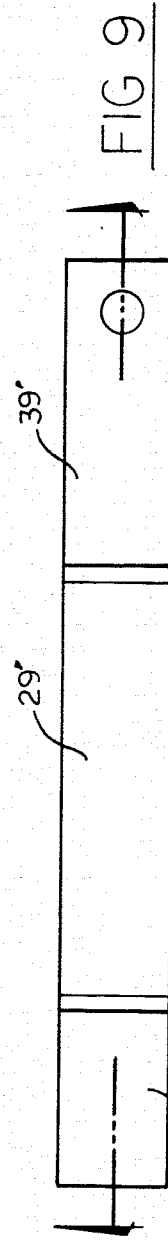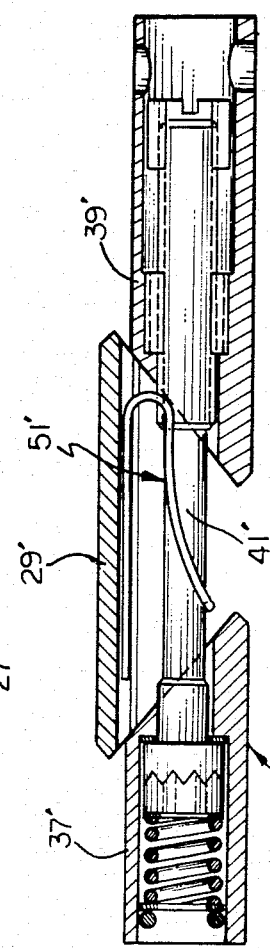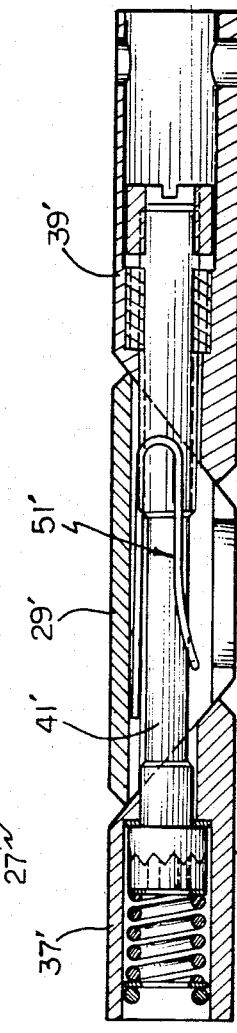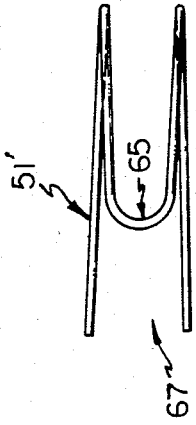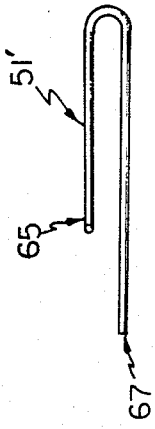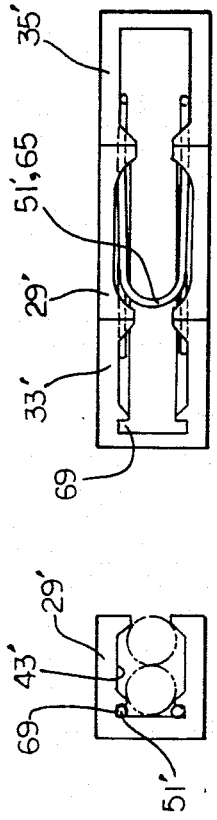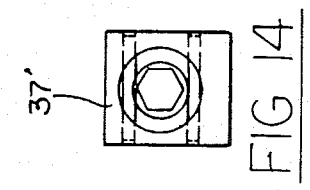

PRINTED CIRCUIT BOARD MOUNTING APPARATUS

BACKGROUND OF THE INVENTION

This invention relates generally to apparatus for mounting and fastening printed circuit boards or cards within a rack or chassis, and, more particularly, to apparatus of the kind that includes an elongated wedge assembly that expands transversely to fasten the board in place.

Elongated wedge assemblies of this particular kind have been in common use for fastening printed circuit (i.e., PC) boards within an elongated slot in a rack or chassis. The assembly typically includes a center wedge having sloped surfaces at its opposite ends and two end wedges having surfaces that abut against the center wedge's opposite ends. A screw extends lengthwise through the center wedge and connects together the two end wedges. Rotating the screw in one direction draws the two end wedges toward each other, causing them to deflect transversely on the sloped abutting surfaces. This increases the assembly's effective width and thereby fastens the PC board tightly within the slot. Subsequently rotating the screw in the opposite direction moves the two end wedges apart from each other, to bring them back into longitudinal alignment with the center wedge and, thereby, to release the clamping force on the PC board. The wedge assemblies can be constructed with any uneven number of wedge segments.

Although the wedge assembly described briefly above has proven generally effective in locking a PC board in place, its use has not proven to be entirely satisfactory. This arises because some applications require that a predetermined force be applied to the PC board, to ensure contact between the board and the chassis track and, thereby, to provide efficient thermal conductivity and/or electrical grounding. A predetermined force is also sometimes required to prevent loosening due to critical vibration forces. In all of these cases, torque wrench measurements have normally been required to provide the desired clamping forces. Further, wedge assemblies of this kind can sometimes damage the PC board, because of overtightening of the screw.

Still another drawback to conventional locking wedge assemblies arises when the screw is loosened, which increases the assembly's length and allows the three wedges to move with respect to each other. Consequently, rotation or transverse movement of the wedges about the screw axis can sometimes make installation of the attached assembly and PC board to the chassis track difficult.

It should, therefore, be appreciated that there is a need for a locking wedge assembly that avoids the above difficulties. The assembly should ideally control the force applied to the PC board and chassis track, and thereby eliminate the need to measure torque each time the assembly is tightened. The wedge assembly also should maintain the wedges aligned with each other when the clamping force is removed, for insertion or extraction of the PC board to or from a chassis track. These features are all provided by the present invention.

SUMMARY OF THE INVENTION

The present invention is embodied in a locking wedge apparatus for mounting and fastening PC boards or cards within a rack or chassis in a way that avoids the need for making torque measurements to ensure proper installation and that provides proper alignment of the apparatus' elements during installation. The apparatus further prevents accidentally over- or under-tightening of the kind that can physically or functionally damage the PC board or make it inoperative. The locking wedge apparatus of the invention includes a center wedge having sloped surfaces at its opposite ends and two end wedges having surfaces that abut against opposite ends of the center wedge. The center wedge is secured to the PC board. A screw extends lengthwise through a channel in the center wedge, to connect together the two end wedges. The channel is dimensioned to allow the screw to move transversely. When the screw is rotated in one direction, the two end wedges, together with the screw, are caused to move transversely relative to the center wedge, to increase the effective transverse width of the apparatus and thereby fasten the PC board in place.

In accordance with the invention, the screw is associated with clutch means for limiting the maximum forward torque that can be applied to the screw and thus the maximum transverse force the wedges can apply to the PC board. The clutch means disengages when more than a predetermined torque is applied. To facilitate a subsequent release of the PC board, the clutch means does not disengage when a reverse (i.e., loosening) torque or comparable magnitude is applied. This can be accomplished using a clutch having intermeshing ratchet teeth with different forward and reverse slope angles.

Other aspects and advantages of the present invention will become apparent from the following description of the preferred embodiments, taken in conjunction with the accompanying drawings, which illustrate, by way of example, the principles of the invention.

BRIEF DESCRIPTION OF THE DRAWINGS

FIG. 9 is a top plan view of the locking wedge assembly embodiment of FIG. 10.

FIG. 10 is a cross-sectional side view of the locking wedge assembly embodiment of FIG. 8, shown in an extended position.

FIG. 11 is a cross-sectional side view similar to FIG. 10, but with the assembly being shown in a retracted position.

FIG. 12 is a top plan view of the center wedge and biasing spring of the locking wedge assembly embodiment of FIG. 8.

FIG. 13 is an end view of the center wedge of FIG. 12, with the allowable transverse movement of the screw being shown in phantom lines.

FIG. 14 is an end view of the locking wedge assembly embodiment of FIG. 8, showing the hex recess of the clutch.

FIG. 15 is a top plan view of the biasing spring of the locking wedge assembly embodiment of FIG. 8.

FIG. 16 is an elevational view of the biasing spring of FIG. 15, shown in its unstressed position.

DESCRIPTION OF THE PREFERRED EMBODIMENTS

Figure 1:
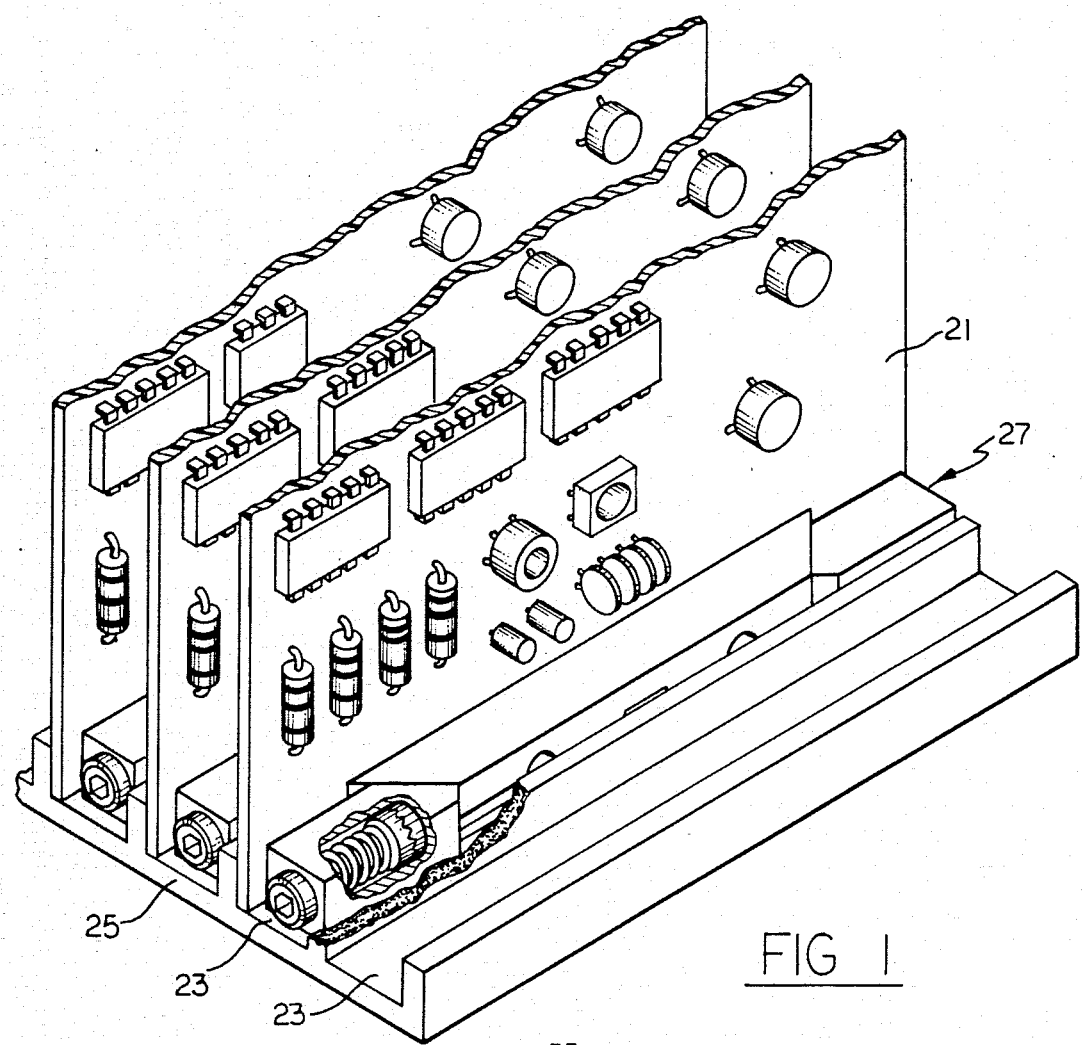
FIG. 1 is a perspective view of a first embodiment of a locking wedge assembly in accordance with the invention, being used to lock a printed circuit board into a rack, a portion of the rack and assembly being cutaway to reveal a clutch.

As shown in the drawings, and particularly in FIG. 1, a printed circuit (i.e., PC) board 21 is retained in an elongated slot 23 formed in a chassis or a rack 25 by means of a locking wedge assembly generally indicated by the reference numeral 27. The slot is of substantially greater width than the thickness of PC board, so as to receive both an edge of the board and the locking wedge assembly.

A first locking wedge assembly embodiment 27 in accordance with the invention is depicted in FIGS. 1-7. It includes an elongated center wedge 29 fixed by screws or rivets 31 (FIGS. 3 and 4) to the edge of the PC board 21. The center wedge includes sloped surfaces 33 and 35 at its opposite ends. Cooperating, first and second end wedges 37 and 39 include sloped surfaces 33a and 35a, respectively, that abut against the sloped surfaces 33 and 35 of the center wedge, and a screw 41 extends through an elongated channel 43 in the center wedge, to interconnect the two end wedges. The head of the screw is part of a clutch 45 positioned within a cylindrical recess in the first end wedge 37. The remote end of the screw engages a threaded bore 47 in the second end wedge 39. A threaded insert 49 (FIG. 4) is located within the bore, to improve thread strength and durability. Thus, rotating the screw in one direction (e.g., clockwise) draws the two end wedges toward each other, while rotating it in the opposite direction moves the two end wedges apart from each other.

Figure 3:
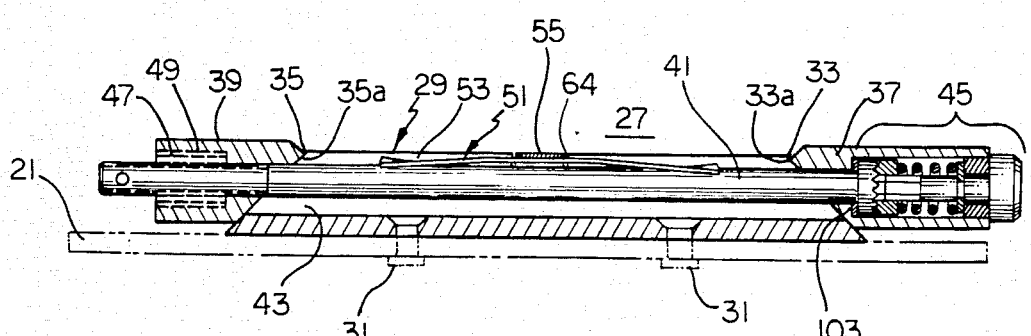
FIG. 3 is a cross-sectional elevational view of the locking wedge assembly of FIG. 1, shown being fastened to a printed circuit board.

The slopes of the abutting surfaces 33 and 33a and 35 and 35a of the center wedge 29 and the respective end wedges 37 and 39 are best depicted in FIG. 3. As a result of these slopes, drawing the two end wedges toward each other by a clockwise rotation of the screw 41 causes the two end wedges to move together transversely relative to the center wedge. The elongated channel 43 in the center wedge is sized to permit this relative transverse movement of the screw. This transverse movement effectively increases the assembly's width, to lock the PC board 21 in the slot 23 formed in the rack 25, as shown in FIG. 1. The PC board is released by reverse rotating the screw, which causes the two end wedges 37 and 39 to move apart from each other.

In accordance with the invention, the locking wedge assembly 27 of FIGS. 1-7 includes a clutch assembly 45 for limiting the maximum forward torque that can be applied to the screw 41. This, in turn, controls the wedge assembly's clamping force, and thus prevents possible physical or functional damage to the PC board 21 being clamped.

With particular reference to FIGS. 1 and 3-6, the clutch assembly 45 includes first and second clutch heads 71 and 73, a compression spring 75, and a driver 77, all located within a cylindrical recess 79 in the first end wedge 37. The second clutch head 73 forms the head of the screw 41, and the first clutch head 71 is urged into contact with the second clutch head by the compression spring 75.

The driver 77 includes an enlarged head 81 with a hexagonal recess 83 sized to receive a conventional hex key wrench (not shown), a cylindrical stem 85, and a hexagonal projection 87. The stem 85 and projection 87 project through the compression spring 75, such that the projection engages a corresponding hexagonal recess 89 in the back side of the first clutch head 71. A knurled plug 90 and snap ring 91 also encircle the stem, between the enlarged head 81 and the compression spring 75.

In use, a hex key wrench (not shown) engages the hex recess 83 of the driver 77, to rotate both the driver and the first clutch head 71. Because the compression spring 75 biases the first clutch head against the second clutch head 73, this rotation is coupled through to the second clutch head and, thus, to the screw 41. A clockwise rotation draws the two end wedges 37 and 39 toward each other, to fasten the PC board 21 in place, as described above.

The confronting faces of the first and second clutch heads 71 and 73 both include a series of ratchet teeth 92 and 93, respectively. The tooth surfaces 95 that engage each other during forward, or clockwise, rotation of the clutch assembly 45 and screw 41 are angled at about 30 degrees with respect to the screw's longitudinal axis. Conversely, the tooth surfaces 97 that engage each other during a reverse, or counterclockwise, rotation are angled at about 20 degrees. This angle difference is depicted schematically in FIG. 6. It should be appreciated that the angles selected for the tooth surfaces may vary according to the torque limits selected, the frictional forces encountered, and the biasing spring force selected.

During a forward rotation of the clutch driver 77, which tightens the wedge assembly 27 against the PC board 21, the screw 41 will eventually encounter significant resistance to further rotation. When this occurs, the tooth surfaces 95 of the first clutch head 71 will begin ramping up on the tooth surfaces of the second clutch head 73, against the yielding resistance of the compression spring 75. Eventually, the first clutch head will be unable to overcome the resisting torque of the second clutch head, and the wedge assembly will be fully tightened to a predetermined torque.

Thereafter, if it is desired to loosen the wedge assembly 27, the clutch driver 77 is rotatably driven in a reverse direction. Torque will be coupled through the first and second clutch head 71 and 73 via the teeth surfaces 97. The smaller angle of the surfaces that engage during this reverse rotation (e.g., 20-degrees rather than 30-degrees) ensures that the torque at which slippage occurs is substantially higher than in the case of a forward rotation.

Figure 2:
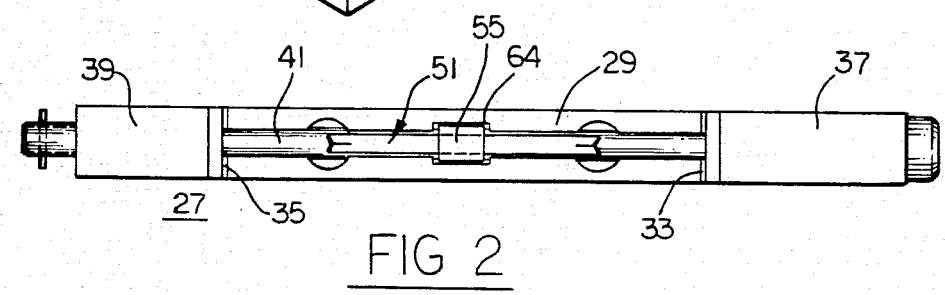
FIG. 2 is a plan view of the locking wedge assembly of FIG. 1.
Figure 4:
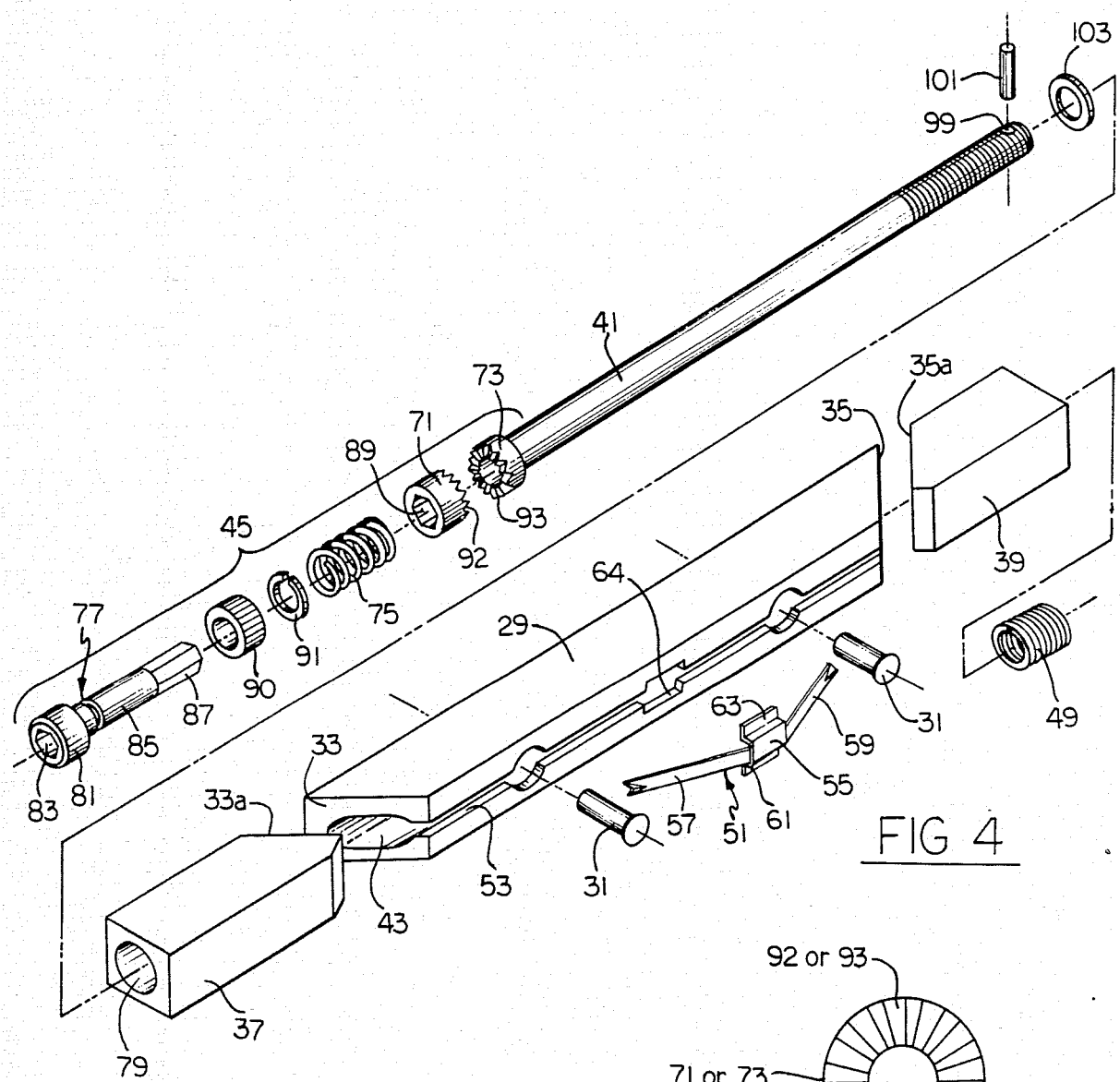
FIG. 4 is an exploded perspective view of the locking wedge assembly of FIG. 1.
Figure 5:
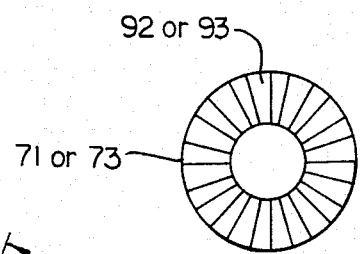
FIG. 5 is a top plan view of one clutch head of the locking wedge assembly of FIG. 1.
Figures 6, 7:
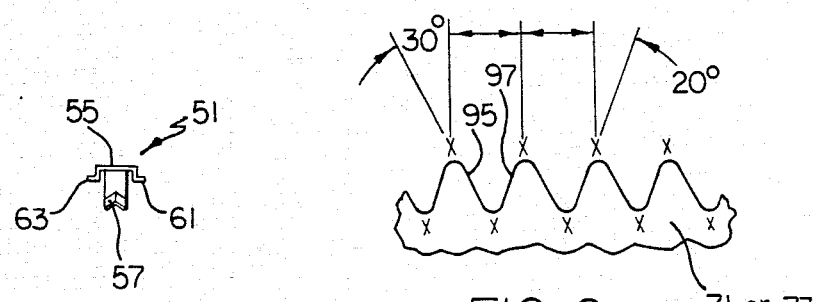
FIG. 6 is a schematic side view of a portion of the clutch head of FIG. 5, showing the different slope angles of the opposite sides of the clutch head's teeth.
FIG. 7 is an end view of a biasing spring included in the locking wedge assembly of FIG. 1.

As best shown in FIGS. 2-4, the remote end of the screw 41 includes a transverse bore 99 for receiving a press-fit pin 101. This prevents an inadvertent disassembly of the wedges 37, 29 and 39 by excessively unthreading the screw.

A low-friction washer 103 is located under the second clutch head 73, to limit excessive friction between the clutch head and the base of the recess 79 of the first end wedge 37. This prevents the clutch head from digging into the wedge, when the head is rotated, which could be misinterpreted as a tightening torque.

The locking wedge assembly 27 of FIGS. 1–4, further includes a biasing spring 51, located between the screw 41 and a wall 53 of the center wedge 29. As shown most clearly in FIGS. 4 and 7, this biasing spring is a flexible band having a central base 55 and two longitudinally extending legs 57 and 59. The remote ends of these legs are recessed, to ride upon the screw. Two flanges 61 and 63 project transversely from the base 55, for the seating in a recess 64 formed in the center wedge wall 53. These flanges thus hold the band in its prescribed position.

The biasing spring 51 is configured to bias the screw 41 away from the wall 53 of the center wedge 29, i.e., toward the PC board 21. This biases the two end wedges 37 and 39 into longitudinal alignment with the center wedge. The biasing thereby serves to maintain the individual end wedges longitudinally aligned with the center wedge and the slot 23 of the rack 25, when the screw is loosened. In addition, biasing the wedges into longitudinal alignment minimizes the assembly's transverse width prior to tightening the screw, to prevent the wedges from rotating relative to each other, about their longitudinal axis, and thereby to facilitate placement of the assembly within the slot.

Figure 8:
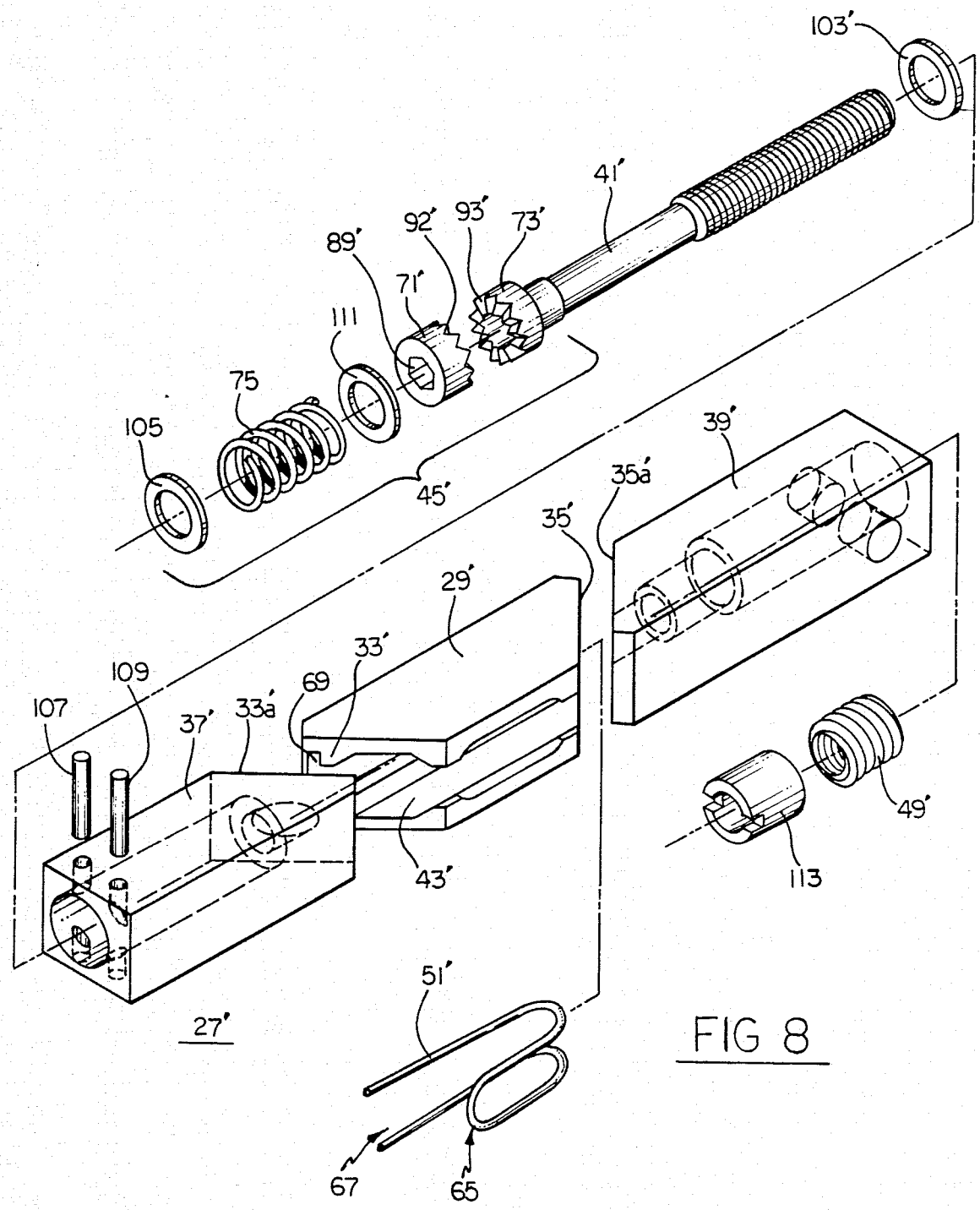
FIG. 8 is an exploded perspective view of a second embodiment of a locking wedge assembly in accordance with the present invention, this embodiment including an alternative biasing spring.

A second locking wedge assembly embodiment 27' is depicted in FIGS. 8–16. Elements of this embodiment corresponding to the embodiment of FIGS. 1–7 are identified by the same reference numerals, but with prime notations. In the embodiment of FIGS. 8–16, the center wedge 29' is significantly shorter than the corresponding center wedge 29 of the embodiment 27 of FIGS. 1–7, but it includes the same sloped surfaces 33' and 35' in abutment with respective abutting surfaces 33a' and 35a' of the end wedges 37' and 39'. In addition, the biasing spring 51' of the second embodiment takes the form of a resilient wire form that is bent, first, into a general U-shape and, second, into a complex shape in which the closed end 65 of the U projects back toward the open end 67 of the U. This is best depicted in FIGS. 8, 15 and 16.

The open end 67 of the spring 51' is slideable into a recess 69 (FIG. 13) located within the channel 43' of the center wedge 29'. The screw 41' slides through the middle of the spring, with the spring's closed end 65 resting directly on it. The spring biases the screw toward the long side of the center wedge, which brings the end wedges 37' and 39' into longitudinal alignment with the center wedge (FIG. 11). As with the embodiment of FIGS. 1–7, described above, this biasing serves to maintain the wedges in longitudinal alignment when the screw is loosened and, further, facilitates installation of the assembly with the PC board 21 into the slot 23 of the rack 25.

An alternate clutch assembly embodiment 45' is shown in the second locking wedge assembly embodiment 27' of FIGS. 8–16. Here, the driver 77 of the first clutch embodiment 45 is eliminated. Plug 90 is replaced by a simple washer 105, which is supported in position by two pins 107 and 109 projecting transversely through the first end wedge 37'. The compression spring 75' is confined between the washer 105 and a second washer 111 located adjacent to the first clutch head 71', to urge the two clutch heads 71' and 73' into engagement with each other.

A hex key wrench (not shown) may be inserted through the washers 105 and 111 and the compression spring 75' to engage the hex recess 89' in the backside of the first clutch head 71' to rotatably drive the two clutch heads 71' and 73' and the screw 41'. Rotating the first clutch head in a clockwise direction advances the screw, to draw the two end wedges 37' and 39' together, as shown in FIG. 10. Conversely, rotating the first clutch head in a counterclockwise direction retracts the screw, to move the end wedges apart from each other, as shown in FIG. 11. The two clutch heads both include specially sloped teeth 91' and 93', as in the embodiment of FIGS. 1–7, to limit the maximum forward torque, but allow a somewhat higher maximum reverse torque. A slotted sleeve 113 is threaded onto the screw's remote end, to prevent an inadvertent unthreading of the screw from the second end wedge 39'.

The wedges of the embodiments described above are preferably, but not necessarily made of aluminum or an aluminum alloy, and the biasing springs are preferably made of stainless steel or the like. The screw in each embodiment can be made of any suitable material such as stainless steel or alloy steel.

It should be appreciated from the foregoing description that the present invention provides an improved locking wedge assembly for locking PC boards into a slot formed in a rack. The disclosed embodiments are all simple in construction, yet completely effective in holding a PC board securely in position. A clutch assembly limits the maximum pressure applied to the board, to reduce the possibility of damage, and a biasing spring maintains the assembly's wedges properly oriented in an extended position when the assembly has been loosened for insertion or removal of the PC board.

Although the present invention has been described in detail with reference only to the presently preferred embodiments, it will be appreciated by those of ordinary skill in the art that various modifications can be made without departing from the invention. Accordingly, the invention is limited only by the following claims.

I claim:

1. A locking wedge apparatus for locking a printed circuit board within an elongated slot in a rack, comprising:
   a center wedge having sloped surfaces at its opposite ends;
   first and second end wedges located at opposite ends of the center wedge and having surfaces that engage the sloped surfaces of the center wedge;
   a screw interconnecting the first and second end wedges, rotation of the screw in a first direction drawing the two end wedges toward each other such that the end wedges and interconnecting screw are deflected transversely by the sloped surfaces of the center wedge, to lock a printed circuit board within an elongated slot in a rack; and
   clutch means cooperating with the screw to limit the maximum forward torque that can be transmitted to the screw, thereby correspondingly limiting the maximum transverse pressure the apparatus can apply to the printed circuit board.

2. A locking wedge apparatus as defined in claim 1, wherein the clutch means transmits a rearward torque to the screw, for unlocking the printed circuit board, that exceeds the maximum forward torque.

3. A locking wedge apparatus for locking a printed circuit board within an elongated slot in a rack, comprising:
- a center wedge having sloped surfaces at its opposite ends;
- first and second end wedges located at opposite ends of the center wedge and having surfaces that engage the sloped surfaces of the center wedge;
- a screw interconnecting the first and second end wedges, rotation of the screw in a first direction drawing the two end wedges toward each other such that the end wedges and interconnecting screw are deflected transversely by the sloped surfaces of the center wedge, to lock a printed circuit board within an elongated slot in a rack;
- means for biasing the first and second end wedges into longitudinal alignment with the center wedge; and
- clutch means cooperating with the screw to limit the maximum forward torque that can be transmitted to the screw, thereby correspondingly limiting the maximum transverse pressure the apparatus can apply to the printed circuit board.

4. A locking wedge apparatus as defined in claim 3, wherein the means for biasing includes a spring located in the channel of the center wedge, the spring being in the form of a U-shaped wire having a closed end wrapped around the screw and an open end received within a recess formed in the center wedge, the spring resisting transverse movement of the screw relative to the center wedge.

5. A locking wedge apparatus for locking a printed circuit board within an elongated slot in a rack, comprising:
- a center wedge having sloped surfaces at its opposite ends;
- first and second end wedges located at opposite ends of the center wedge and having surfaces that engage the sloped surfaces of the center wedge;
- a screw interconnecting the first and second end wedges, rotation of the screw in a first direction drawing the two end wedges toward each other such that the end wedges and interconnecting screw are deflected transversely by the sloped surfaces of the center wedge, to lock a printed circuit board within an elongated slot in a rack; and
- means for biasing the first and second end wedges into longitudinal alignment with the center wedge; and
- clutch means cooperating with the screw to limit the maximum forward torque that can be transmitted to the screw, thereby correspondingly limiting the maximum transverse pressure the apparatus can apply to the printed circuit board, wherein the clutch means is adapted to transmit a rearward torque to the screw, for unlocking the printed circuit board, that exceeds the maximum forward torque.

6. A locking wedge apparatus as defined in claim 5, wherein the means for biasing includes a spring located in the channel of the center wedge, the spring being in the form of a U-shaped wire having a closed end wrapped around the screw and an open end received within a recess formed in the center wedge, the spring resisting transverse movement of the screw relative to the center wedge.

* * * * *